(12) United States Patent
Hammers et al.

(10) Patent No.: US 10,224,869 B1
(45) Date of Patent: Mar. 5, 2019

(54) SOLAR PANEL MODULE WITH INCREASED VOLUME OF SOLAR PRODUCTION

(71) Applicants: David Lawrence Hammers, Wishon, CA (US); Hormoz Shamony, Turlock, CA (US)

(72) Inventors: David Lawrence Hammers, Wishon, CA (US); Hormoz Shamony, Turlock, CA (US)

( * ) Notice: Subject to any disclaimer, the term of this patent is extended or adjusted under 35 U.S.C. 154(b) by 0 days.

(21) Appl. No.: 15/852,498

(22) Filed: Dec. 22, 2017

Related U.S. Application Data

(62) Division of application No. 14/948,088, filed on Nov. 20, 2015, now Pat. No. 9,887,664.

(60) Provisional application No. 62/128,303, filed on Mar. 4, 2015.

(51) Int. Cl.
*H02S 40/22* (2014.01)
*H02S 30/10* (2014.01)
*H01L 31/048* (2014.01)
*H01L 25/04* (2014.01)

(52) U.S. Cl.
CPC ............ *H02S 40/22* (2014.12); *H01L 25/043* (2013.01); *H01L 31/048* (2013.01); *H02S 30/10* (2014.12); *Y02E 10/52* (2013.01)

(58) Field of Classification Search
CPC ....... H02S 40/22; H02S 30/10; H01L 25/043; H01L 31/048
See application file for complete search history.

(56) References Cited

U.S. PATENT DOCUMENTS

2011/0146755 A1\* 6/2011 Curran .................. H01L 27/302
136/246

\* cited by examiner

*Primary Examiner* — Tae-Sik Kang
(74) *Attorney, Agent, or Firm* — Plager Schack LLP; Mark H. Plager; Alexis J. Saenz

(57) ABSTRACT

A solar panel module provides increased efficiency in solar production within a volume of area within a space's square footage. In general, embodiments arrange solar panels into polygonal shaped containers. The containers include inward facing solar cell faces that project orthogonally from a common base. The solar cell faces reflect sunlight captured within the module's volume and reflect it from one incident solar cell face onto one or more other inward facing surfaces of the plurality of panels joined together to form the polygonally shaped module. Thus, solar energy which is typically reflected off when incident upon a conventional solar panel is recaptured by adjacent panels in the module.

7 Claims, 5 Drawing Sheets

SOLAR PANEL MODULE WITH INCREASED VOLUME OF SOLAR PRODUCTION

CROSS-REFERENCE TO RELATED APPLICATIONS

This application claims benefit under 35 U.S.C. § 119(e) of U.S. Provisional Application having Ser. No. 62/128,303 filed Mar. 4, 2015, and U.S. Non-provisional application Ser. No. 14/948,088 filed Nov. 20, 2015, which are hereby incorporated by reference herein in their entirety.

BACKGROUND

The embodiments herein relate generally to renewable energy systems, and more particularly, to a solar panel module with increased volume of solar production.

Currently solar arrays use one solar panel attached to a rack and rail system. The solar panels are typically positioned end to end in an array on a single plane to gather solar energy that passes overhead. Thus the amount of solar production available for a rooftop for example, is limited to the available usable two-dimensional square footage of the roof. Some roofs may have a very limited usable footprint if other rooftop articles such as ventilation pipes, HVAC systems, chimneys, and roofing not facing the path of the sun are present.

As can be seen, there is a need for an efficient solar system that makes the most of available space.

SUMMARY

According to one embodiment of the subject technology, a solar panel module for increasing solar production within a two-dimensional space comprises a frame defining a volume of space; a first solar panel coupled to the frame; a second solar panel coupled to the frame, wherein the first solar panel and the second solar panel are positioned within the frame's volume of space; and a light guide coupled to the frame, the light guide positioned to direct a light source to at least the second solar panel within the frame's volume of space.

According to another embodiment, a solar panel module for increasing solar production within a two-dimensional space comprises a frame defining a volume of space; a first solar panel coupled to the frame, wherein the first solar panel includes a first top surface of photocells facing outward toward a light source; a second solar panel coupled to the frame, wherein the second solar panel includes a second top surface of photocells facing toward a rear surface of the first solar panel, the second top surface of photocells being obstructed from view of the light source by the first solar panel; and a light guide coupled to a periphery of the frame and a periphery of the first solar panel, the light guide positioned to direct the light source to the second top surface of photocells of the second solar panel within the frame's volume of space.

According to yet another embodiment, a polygonal solar panel module for increasing solar production in an area comprises at least three solar panels arranged to project orthogonally upward from a common base and defining an open volume of space between the panels, wherein: at least two of the solar panels are coupled together at a joint, and each solar panel includes a face of solar cells facing inward into the volume of space and toward at least one other solar panel's face of solar cells.

BRIEF DESCRIPTION OF THE FIGURES

The detailed description of some embodiments of the present invention is made below with reference to the accompanying figures, wherein like numerals represent corresponding parts of the figures.

DETAILED DESCRIPTION OF CERTAIN EMBODIMENTS

Figure 1:
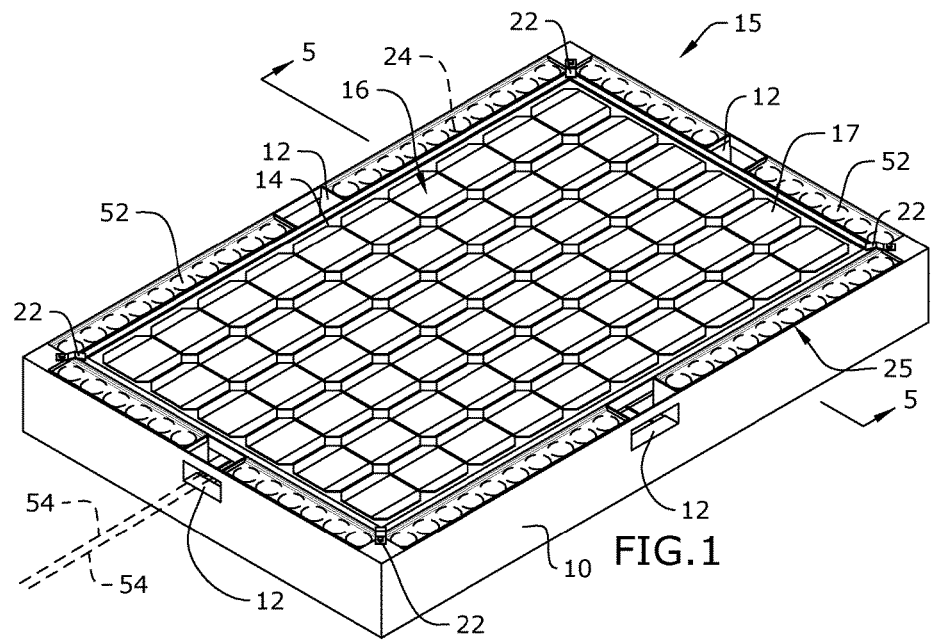
FIG. 1 is a top perspective view of a solar panel module in accordance with an exemplary embodiment of the subject technology.
Figure 2:
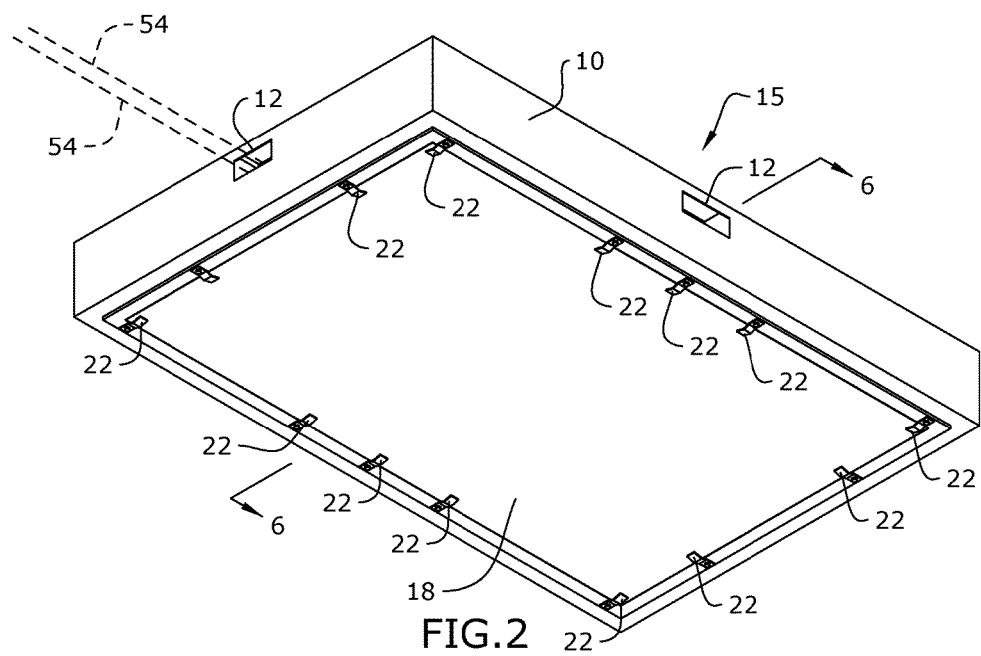
FIG. 2 is a bottom perspective view of the solar panel module of FIG. 1.
Figure 3:
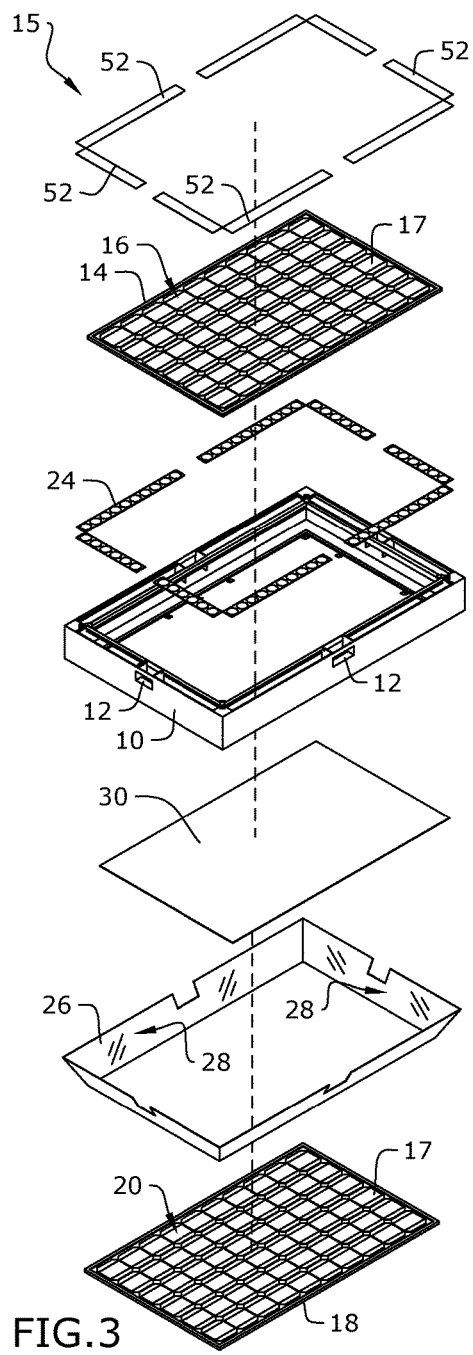
FIG. 3 is an exploded view of the solar panel module of FIG. 1.
Figure 4:
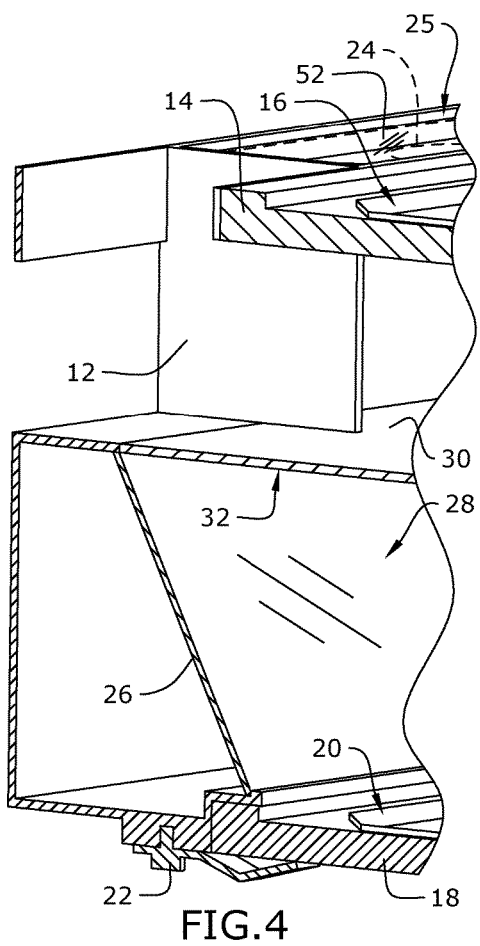
FIG. 4 is an enlarged, partial cross-sectional perspective view of the solar panel module of FIG. 1.
Figure 5:
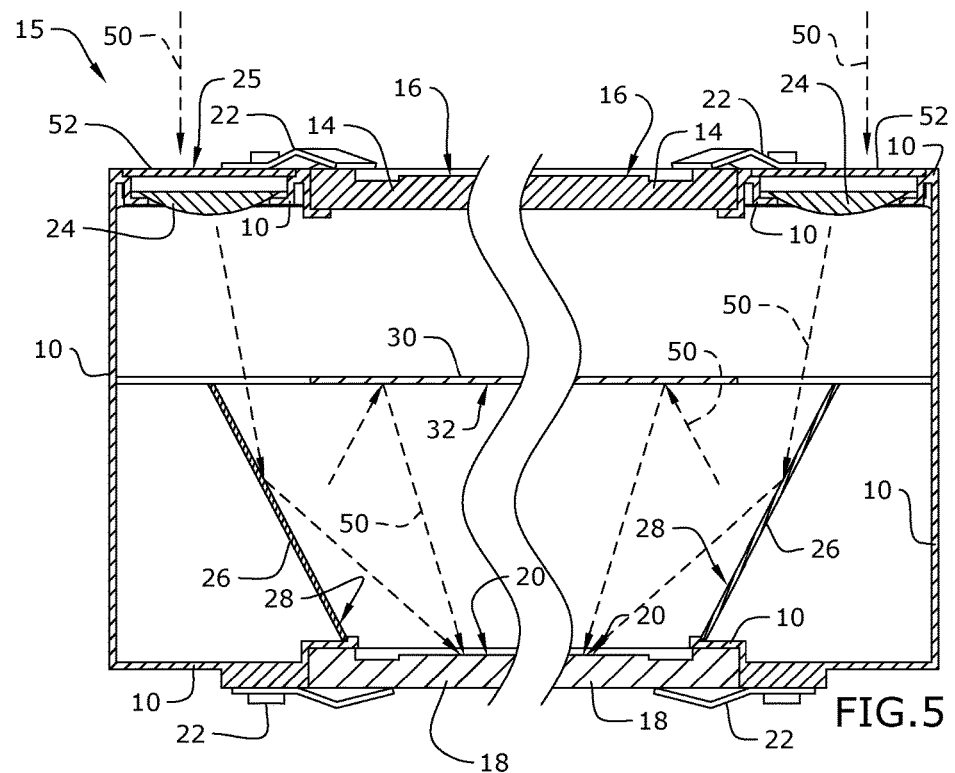
FIG. 5 is a broken cross-sectional view taken along the line 5-5 of FIG. 1.
Figure 6:
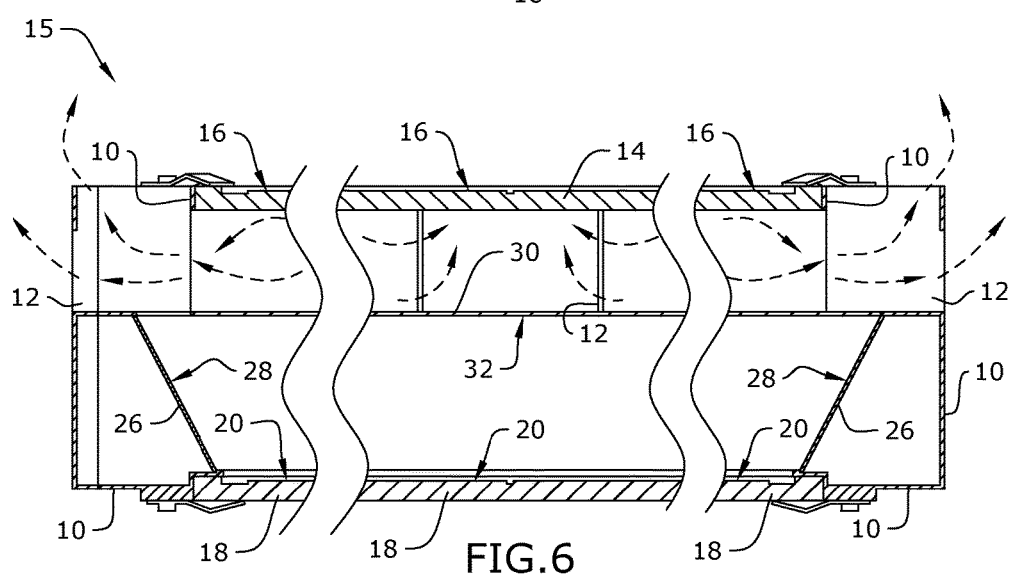
FIG. 6 is a broken cross-sectional view taken along the line 6-6 of FIG. 2.

The word "exemplary" is used herein to mean "serving as an example or illustration." Any aspect or design described herein as "exemplary" is not necessarily to be construed as preferred or advantageous over other aspects or designs.

In general, exemplary embodiments provide a solar panel module that provides increased efficiency solar production within a volume of a two-dimensional space's square footage. Aspects of the subject technology include multiple solar panels within a fixed volume of space and guide light to a panel(s) that would be otherwise obstructed from solar radiation. As may be appreciated, the footprint for collecting solar power from fixed square footage may be increased many fold depending on the configuration.

Referring now to FIGS. 1-6, a solar panel module 15 is shown according to an exemplary embodiment. In general, the solar panel module 15 includes a frame 10 defining a volume of space. Attached to the frame 10 are a first solar panel 14 and a second solar panel 18 in the volume of space. In addition, a light guide 25 is coupled to the frame 10 and positioned to direct a light source 50 (for example solar radiation) to at least the second solar panel 18 within the frame's volume of space. In the exemplary embodiment shown, the frame 10 is a rectangular box. While two solar panels 14 and 18 are shown, it will be understood that more than just two panels may be incorporated within the scope of embodiments contemplated herein. The first solar panel 14 with its photovoltaic side or top surface 16 of photocells 17 may be positioned so that the photocells 17 face outward in the direction of the light source 50. The second solar panel 18 may be positioned parallel to the first solar panel 14. For example, within the frame 10, the second solar panel 18 may be arranged to sit underneath the first solar panel 14 so that the photovoltaic side or top surface 20 of the second solar panel 18 faces the rear of the first solar panel 14 and toward the same direction as the photovoltaic side 16, albeit obstructed from the ambient light source 50. Generally, the second solar panel 18 is spaced from the first solar panel 14 so that there is room for reflected light 50 from the light guide 25 to shine on the photovoltaic side 20 of the second solar panel 18. Some embodiments may be configured so that the second solar panel 18 is insertable/removable from the frame 10 and held/accessed by latches 22.

The solar panel module's light guide 25 may include for example, one or more lenses 24 guiding solar radiation (light 50) to the second solar panel 18. For example, a plurality of plano-convex lenses 24 may be positioned around the periphery of the frame 10 (and in some embodiments, the periphery of the solar panel 14) and angled to direct light at the photovoltaic side 20. The lens(es) 24 may be protected by a tempered glass cover(s) 52. Some embodiments may include a mirror 26 behind the lens(es) 24. The mirror 26 may be a polished metal or reflective glass wall with reflective sides 28 that may surround or frame the perimeter of the second solar panel 18. The mirror 26 may be angled with the top edge extending wider in area than the area of the first solar panel 14 and the bottom edge tapers inward toward the edge(s) of the second solar panel 18. Some embodiments may include a mirror sheet 30 on the rear of the first solar panel 14 with a mirror surface 32 facing the photovoltaic side 20.

In operation, light 50 that is on the periphery of the first solar panel 14 which is normally not absorbed and converted may be gathered by the surrounding light guide 25 and re-directed to the second solar panel 18 within the same volume of space. Light incident on the len(es) 24 may be focused and reflected off the mirror 26 to the photovoltaic surface 20 of the underlying second solar panel 18. Reflected light that scatters off the photovoltaic side 20 may be reflected back onto the photovoltaic side 20 (see for example FIG. 5) for solar conversion by the combination of the reflective surfaces 28 and reflective surface 32 thus harnessing more light that would otherwise be lost. Some embodiments may include one or more exhaust ports 12 on the frame 10 so that heat buildup may circulate out from the space between the first solar panel 14 and the second solar panel 18 (see FIG. 6). Some embodiments may also use the exhaust ports 12 as an opening for output wiring 54 that will be connected to a grid (not shown). The lenses 24 may be approximately 2¾", the light guide 25 opening may be approximately 3¼", the overall frame size may be approximately 4'×6', the flat area of the top of the frame for the lens guide may be approximately between 4" to 5" wide. As will be appreciated, while the footprint of the light guide 25 capturing the light on the periphery of the first solar panel 14 is much smaller than the footprint of the unobstructed first solar panel 14, the solar generation of the second solar panel 18 is nearly as productive as the first solar panel 14. Tests show that the second solar panel 18 may produce between 85% to 95% efficiency (with an average efficiency of about 90%) of the output of the first solar panel 14. Thus, solar generation may be nearly doubled using just two solar panels within the same volume of space. As may be appreciated, aspects of the subject technology may further increase the solar production within a volume of space using a light guide to direct ambient light to more than two solar panels.

Figure 7:
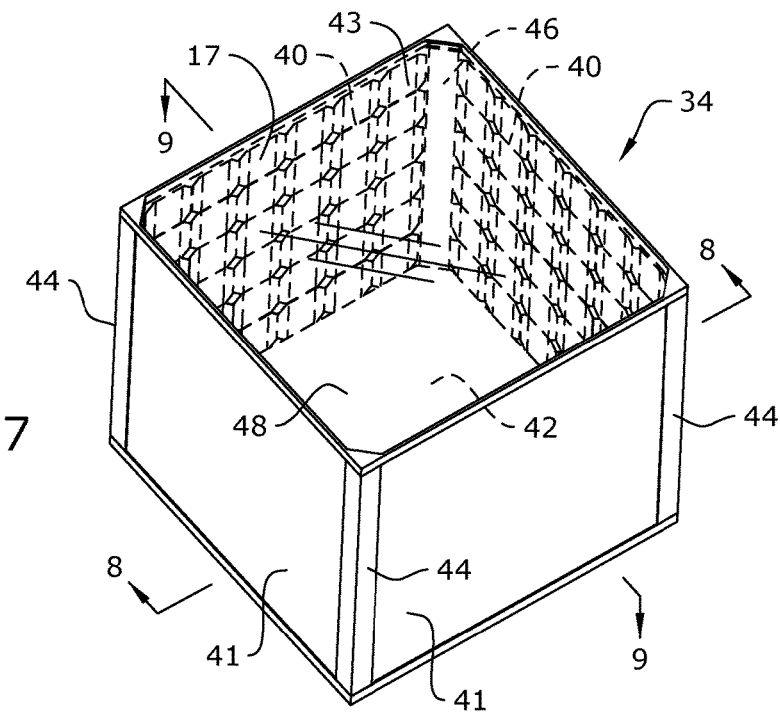
FIG. 7 is a top perspective view of a solar panel module in accordance with another exemplary embodiment of the subject technology.
Figure 8:
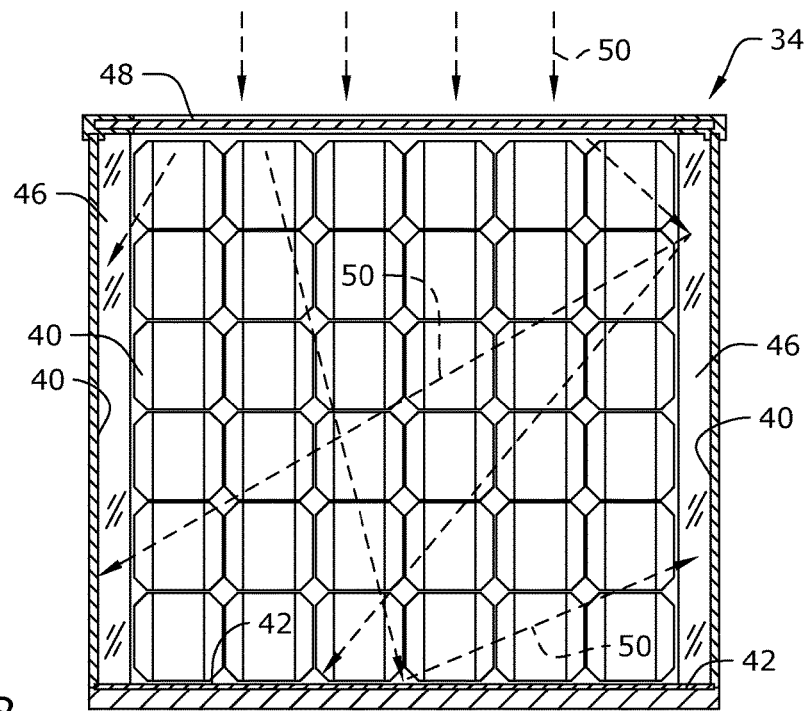
FIG. 8 is a cross-sectional view taken along the line 8-8 of FIG. 7.
Figure 9:
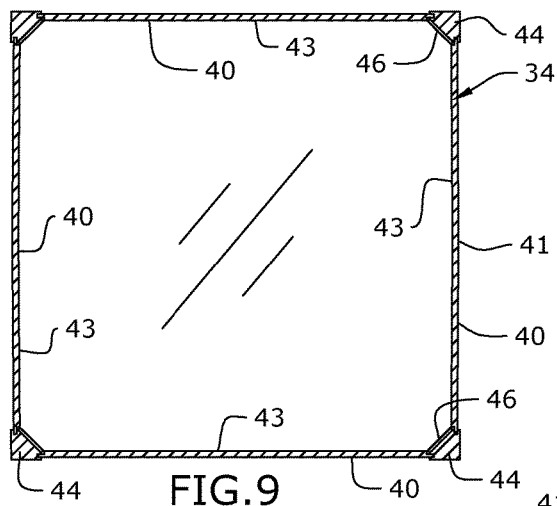
FIG. 9 is a cross-sectional view taken along the line 9-9 of FIG. 7.

Referring now to FIGS. 7-9, another exemplary embodiment of a solar panel module 34 (referred to in general as module 34) is shown using an open-faced polygon arrangement. As may be appreciated, aspects of the subject technology allow for a variety of polygonal volume arrangements so that multiple solar panels 40 are framed within the same volume of space to receive light incident on or proximate to the two dimensional square occupied by the module increasing the amount of solar energy converted. The module 34 may include a plurality of walls 41 joined together to form a polygon. A solar panel 40 may be included on respective walls 41 so that the photovoltaic side 43 of each wall faces inward and toward at least a portion of one other wall. In the embodiment shown, the module 34 is a cube-shaped frame with four solar panels 40. A light guide 48 (for example a lens) may capture solar radiation and direct to the interior of the frame and onto the photovoltaic surfaces 40. Some embodiments may include interior mirrored corners 46 (supported by gussets 44) at the junction of walls and a reflective bottom surface 42. Referring to FIG. 8, in operation, light beams 50 may enter through the lens 48 and may be directly incident onto the plurality of photovoltaic surfaces 40 or may reflect off of the reflective surface 42 and mirrored corners 46 to provide increased light absorption for solar conversion.

Figure 10:
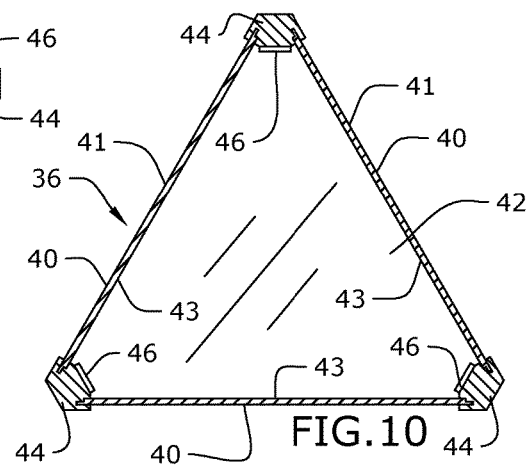
FIG. 10 is a cross-sectional view of an alternate embodiment of the solar panel module of FIG. 8.
Figure 11:
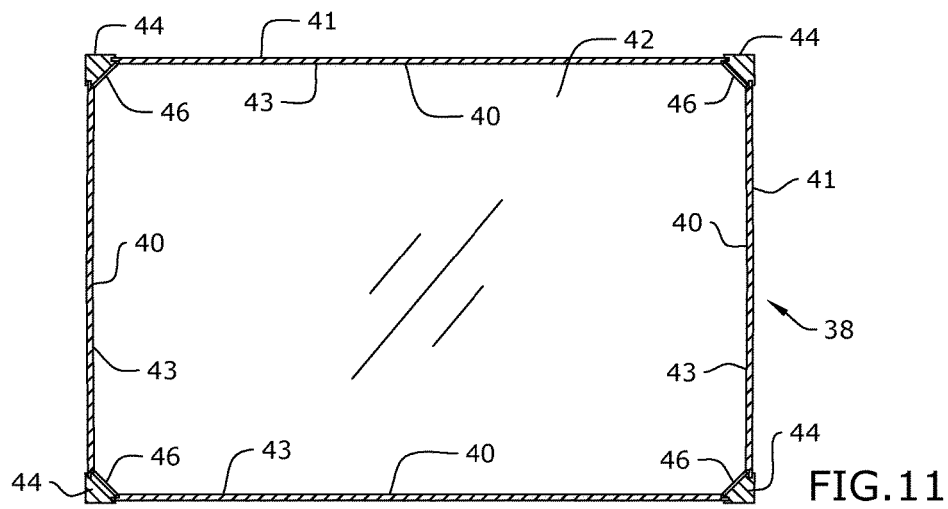
FIG. 11 is a cross-sectional view of an alternate embodiment of the solar panel module of FIG. 8.

Persons of ordinary skill in the art may appreciate that numerous design configurations may be possible to enjoy the functional benefits of the inventive systems. Thus, given the wide variety of configurations and arrangements of embodiments of the present invention the scope of the present invention is reflected by the breadth of the claims below rather than narrowed by the embodiments described above. For example, referring now to FIG. 10, a solar panel module 36 may use a triangular cross-section instead of a cube shape so that light entering the top of the module 36 may bounce around onto a plurality of solar panels 40 for increased solar conversion. FIG. 11 shows another embodiment using a rectangular cross-section for a solar panel module 38 that operates similar to the module 34 but with shorter and longer paths of reflection before absorption and conversion is achieved.

Terms such as "top," "bottom," "front," "rear," "above," "below" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Similarly, an item disposed above another item may be located above or below the other item along a vertical, horizontal or diagonal direction; and an item disposed below another item may be located below or above the other item along a vertical, horizontal or diagonal direction.

What is claimed is:

1. A polygonal solar panel module for increasing solar production in an area, comprising:
    at least three solar panels arranged to project orthogonally upward from a common base defining an empty and unobstructed open volume of space between the at least three solar panels, wherein the at least three solar panels form a three-dimensional polygon around the empty and unobstructed open volume of space, wherein:
    each solar panel of the at least three solar panels are coupled together to two adjacent solar panels of the at least three solar panels at joints that are orthogonal from the common base with the empty and unobstructed open volume of space among at least three joints, and
    each solar panel of the at least three solar panels includes a face of solar cells facing inward into the empty and unobstructed open volume of space and toward at least one face of solar cells of other solar panels.

2. The polygonal solar panel module of claim 1, further comprising a lens coupled to an open end of the at least three solar panels, the lens disposed to direct sunlight into the empty and unobstructed open volume of space and to at least two of the at least three solar panels.

3. The polygonal solar panel module of claim 2, further comprising an angled mirror corner on at least one of the joints, the angled mirror corner disposed to reflect the sunlight toward one or more faces of the solar cells.

4. The solar polygonal panel module of claim 3, further comprising a reflective bottom surface at a bottom of the empty and unobstructed open volume of space, wherein the reflective bottom surface and the angled mirror corner reflect the sunlight from the lens to the solar cells.

5. The polygonal solar panel module of claim 1, wherein the at least three solar panels are arranged in an open-ended triangle prism.

6. The polygonal solar panel module of claim 1, wherein the at least three solar panels are arranged in an open-ended rectangular prism.

7. A polygonal solar panel module for increasing solar production in an area, comprising:
   at least three solar panels arranged to project orthogonally upward from a common base and defining an open volume of space between the panels, wherein:
   at least two solar panels of the at least three solar panels are coupled together at a joint, and
   each solar panel of the at least three solar panels includes a face of solar cells facing inward into the open volume of space and toward at least one face of solar cells of other solar panels; and
   a lens coupled to an open end of the at least three solar panels, the lens disposed to direct sunlight into the open volume of space and to at least two of the at least three solar panels.

* * * * *